United States Patent
Kalluri et al.

(10) Patent No.: US 12,013,420 B2
(45) Date of Patent: Jun. 18, 2024

(54) ALTERNATIVE VOLTAGE MEASUREMENT OVER EXTENDED OPERATING CONDITIONS

(71) Applicant: Hamilton Sundstrand Corporation, Charlotte, NC (US)

(72) Inventors: Nageswara Rao Kalluri, Karnataka (IN); David Frederick Brookes, Birmingham (GB); Sridhar Katakam, Karnataka (IN); Surendra Somasekhar Valleru, Karnataka (IN); Pravinsharma Kaliyannan Eswaran, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 27 days.

(21) Appl. No.: 17/749,220

(22) Filed: May 20, 2022

(65) Prior Publication Data

US 2023/0305041 A1      Sep. 28, 2023

(30) Foreign Application Priority Data

Mar. 25, 2022   (IN) .............................. 202211016944

(51) Int. Cl.
*G01R 19/00*          (2006.01)
*H03K 5/24*           (2006.01)

(52) U.S. Cl.
CPC .......... *G01R 19/0038* (2013.01); *H03K 5/24* (2013.01)

(58) Field of Classification Search
CPC .............................. G01R 19/0038; H03K 5/24
See application file for complete search history.

(56) References Cited

U.S. PATENT DOCUMENTS 9,673,743 B1    6/2017  Billson et al.
10,107,841 B2  10/2018  Tasevski et al.
(Continued)

FOREIGN PATENT DOCUMENTS

CN      108490241 A     9/2018
CN      112346381 A     2/2021
(Continued)

OTHER PUBLICATIONS

Abstract for CN108490241 (A), Published: Sep. 4, 2018, 1 page.
European Search Report for Application No. 23163840.4, dated Jul. 20, 2023, 5 pages.

*Primary Examiner* — Feba Pothen
(74) *Attorney, Agent, or Firm* — CANTOR COLBURN LLP

(57) ABSTRACT

A voltage measurement system and method is provided. Aspects include a comparator having a positive and a negative input terminal, a processor configured to supply a reference voltage signal to the negative input terminal, wherein the positive input terminal receives an input voltage, setting the reference voltage signal to a zero voltage signal, determine a line frequency of the input voltage based on a timing signal from the comparator and determining a first pulse width of the input signal based on the timing signal, set the reference voltage to a PWM signal with a fixed duty cycle, receive the timing signal from the output of the comparator, determine a rising edge and a falling edge associated with the input voltage based on the timing signal, and determine a peak value of the input voltage based on a second pulse width between the rising and falling edge.

20 Claims, 4 Drawing Sheets

(56) References Cited

U.S. PATENT DOCUMENTS

| | | |
|---|---|---|
| 11,092,464 B2 | 8/2021 | Hess et al. |
| 11,630,133 B2 * | 4/2023 | Zhu ........................ H02M 1/36 |
| | | 324/609 |
| 2010/0073974 A1 | 3/2010 | Zeng et al. |
| 2016/0164430 A1 * | 6/2016 | Chen ...................... G01R 19/22 |
| | | 363/89 |

FOREIGN PATENT DOCUMENTS

| | | |
|---|---|---|
| CN | 111142021 B | 1/2022 |
| GB | 2324161 A | 10/1998 |
| WO | 2009128006 A1 | 10/2009 |

* cited by examiner

ALTERNATIVE VOLTAGE MEASUREMENT OVER EXTENDED OPERATING CONDITIONS

CROSS-REFERENCE TO RELATED APPLICATIONS

This application claims the benefit of Indian Patent Application No. 202211016944 filed Mar. 25, 2022, which is incorporated herein by reference in its entirety.

BACKGROUND

The present invention generally relates to voltage measurements, and more specifically to, an improved accuracy for voltage measurement over extended operating conditions.

Operating conditions on aircraft can include a temperature range between −55° C. to +100° C. With these extended operating conditions, components utilized for tasks such as measuring voltages from sensors and other devices can have a higher associated costs due to the need for the component having a larger temperature operating range. For example, analog-to-digital converters (ADCs) increase in cost for larger temperature operating ranges. Designing systems for wide temperature ranges while decreasing costs can present a challenge in design. One methodology is to design systems that do not require the use of certain components that drive up the costs while maintaining accuracy of the systems.

BRIEF DESCRIPTION

Embodiments of the present invention are directed to a voltage measurement system. A non-limiting example of the voltage measurement system includes a comparator having a positive input terminal and a negative input terminal, a processor configured to supply a reference voltage signal to the negative input terminal of the comparator, wherein the positive input terminal of the comparator receives an input voltage, setting the reference voltage signal to a zero voltage signal, determine a line frequency of the input voltage based on a timing signal from an output of the comparator and determining a first pulse width of the input signal based on the timing signal, set the reference voltage to a pulse width modification signal with a fixed duty cycle, receive the timing signal from the output of the comparator, determine a rising edge and a falling edge associated with the input voltage based on the timing signal, and determine a peak value of the input voltage based on a second pulse width between the rising edge and falling edge of the input voltage.

In addition to or as an alternative to any prior system, determining the line frequency of the input voltage based on a timing signal from the output of the comparator and determining a pulse width associated with the timing signal can include: determining a second rising edge associated with the input voltage based on the timing signal; determining a second falling edge associated with the input voltage based on the timing signal; and calculating the pulse width based on an output of the comparator between the second rising edge and the second falling edge.

In addition to or as an alternative to any prior system, determining the peak value of the input voltage based on the second pulse width between the rising edge and falling edge of the input voltage can include: determining a delta between the first pulse width and the second pulse width; and calculating the peak value of the input voltage based on the delta and the line frequency.

In addition to or as an alternative to any prior system, the first pulse width can be larger than the second pulse width.

In addition to or as an alternative to any prior system, the input voltage can be scaled prior to be received by the comparator.

In addition to or as an alternative to any prior system, the input voltage can be a voltage reading taken from a component on an aircraft.

In addition to or as an alternative to any prior system, the system can further include: a resistor capacitor (RC) circuit connected between a reference signal output of the processor and the negative input terminal of the comparator.

In addition to or as an alternative to any prior system, the system can further include: a buffer circuit connected between the RC circuit and the reference signal output of the processor, wherein the buffer circuit includes a reference voltage supply voltage.

In addition to or as an alternative to any prior system, the system can further include: a digital isolation circuit connected between the buffer circuit and the reference signal output of the processor.

In addition to or as an alternative to any prior system, the system can further include: a digital isolation circuit coupled between the output of the comparator and the processor.

Embodiments of the present invention are directed to a method. A non-limiting example of the method includes providing, by a processor, a reference voltage signal to a negative input terminal of a comparator, wherein a positive input terminal of the comparator receives an input voltage, setting, by the processor, the reference voltage signal to a zero voltage signal, determining, by the processor, a line frequency of the input voltage based on a timing signal from an output of the comparator and determining a first pulse width of the input signal based on the timing signal, setting, by the processor, the reference voltage to a pulse width modification signal with a fixed duty cycle, receiving the timing signal from the output of the comparator, determining a rising edge and a falling edge associated with the input voltage based on the timing signal, and determining a peak value of the input voltage based on a second pulse width between the rising edge and falling edge of the input voltage.

In additional to or as an alternative to any prior method, determining the line frequency of the input voltage based on a timing signal from the output of the comparator and determining a pulse width associated with the timing signal can include: determining a second rising edge associated with the input voltage based on the timing signal; determining a second falling edge associated with the input voltage based on the timing signal; and calculating the pulse width based on an output of the comparator between the second rising edge and the second falling edge.

In additional to or as an alternative to any prior method, determining the peak value of the input voltage based on the second pulse width between the rising edge and falling edge of the input voltage can include: determining a delta between the first pulse width and the second pulse width; and calculating the peak value of the input voltage based on the delta and the line frequency.

In additional to or as an alternative to any prior method, the first pulse width can be larger than the second pulse width.

In additional to or as an alternative to any prior method, the input voltage may be scaled prior to be received by the comparator.

In additional to or as an alternative to any prior method, the input voltage may be a voltage reading taken from a component on an aircraft.

In additional to or as an alternative to any prior method, a resistor capacitor (RC) circuit may be connected between a reference signal output of the processor and the negative input terminal of the comparator.

In additional to or as an alternative to any prior method, a buffer circuit can be connected between the RC circuit and the reference signal output of the processor.

In additional to or as an alternative to any prior method, a digital isolation circuit is connected between the buffer circuit and the reference signal output of the processor.

In additional to or as an alternative to any prior method, a digital isolation circuit may be coupled between the output of the comparator and the processor.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Figure 1:
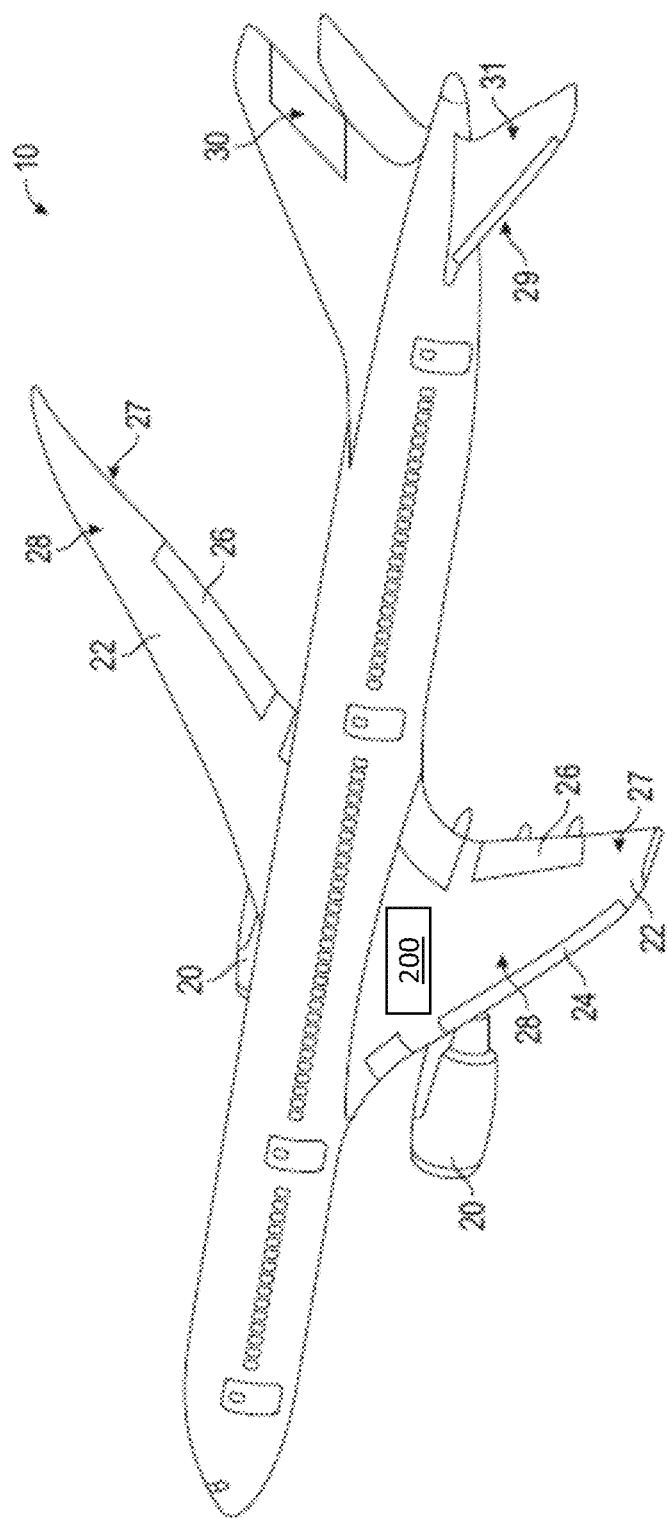
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes an system 200 (described in greater detail in FIG. 2) which allows AC voltage measurement without the need for analog to digital converters to be utilized for various instrumentation on board the aircraft 10.

Turning now to an overview of technologies that are more specifically relevant to aspects of the disclosure, in aircraft applications, meeting the required resolution, accuracy of AC voltage measurement over the extended operating temperature (−55° C. to +100° C.) can present challenges. Conventional designs for measuring an AC voltage typically use commercial off the shelf analog to digital converters (ADC) to sample and digitize an input AC voltage. For a given resolution and accuracy, selecting the correct ADC with a wide operating temperature presents challenges. Because of the need for more resolution and accuracy within these temperature ranges, AC voltage measurement systems have been utilizes premium ADC parts that have associated premium costs with fewer suppliers for supplying these premium ADC parts. Further, these premium ADC parts place a computational burden on the computational engine (e.g., FPGA, DSP, etc.) for the specified mathematical accuracy and logic consumption. Use of available premium ADCs in safety critical applications can lead to more scrutiny for verification and final certification. In many cases, the ADC will be multiplexed to measure different parameters, detecting the faults on the AC measurements some times increases ADC sampling requirements with a lower response time. Finally, one engineering practice is to design a system with dissimilar designs to meet particular safety requirements to remove common mode failures.

Aspects of the present disclosure address the above described issues by providing a system for AC voltage measurement without using an ADC and utilizing the computational engine core capabilities. Exemplary computational engines include, but are not limited to, field programmable gate arrays (FPGAs) and digital signal processors (DSPs).

Figure 2:
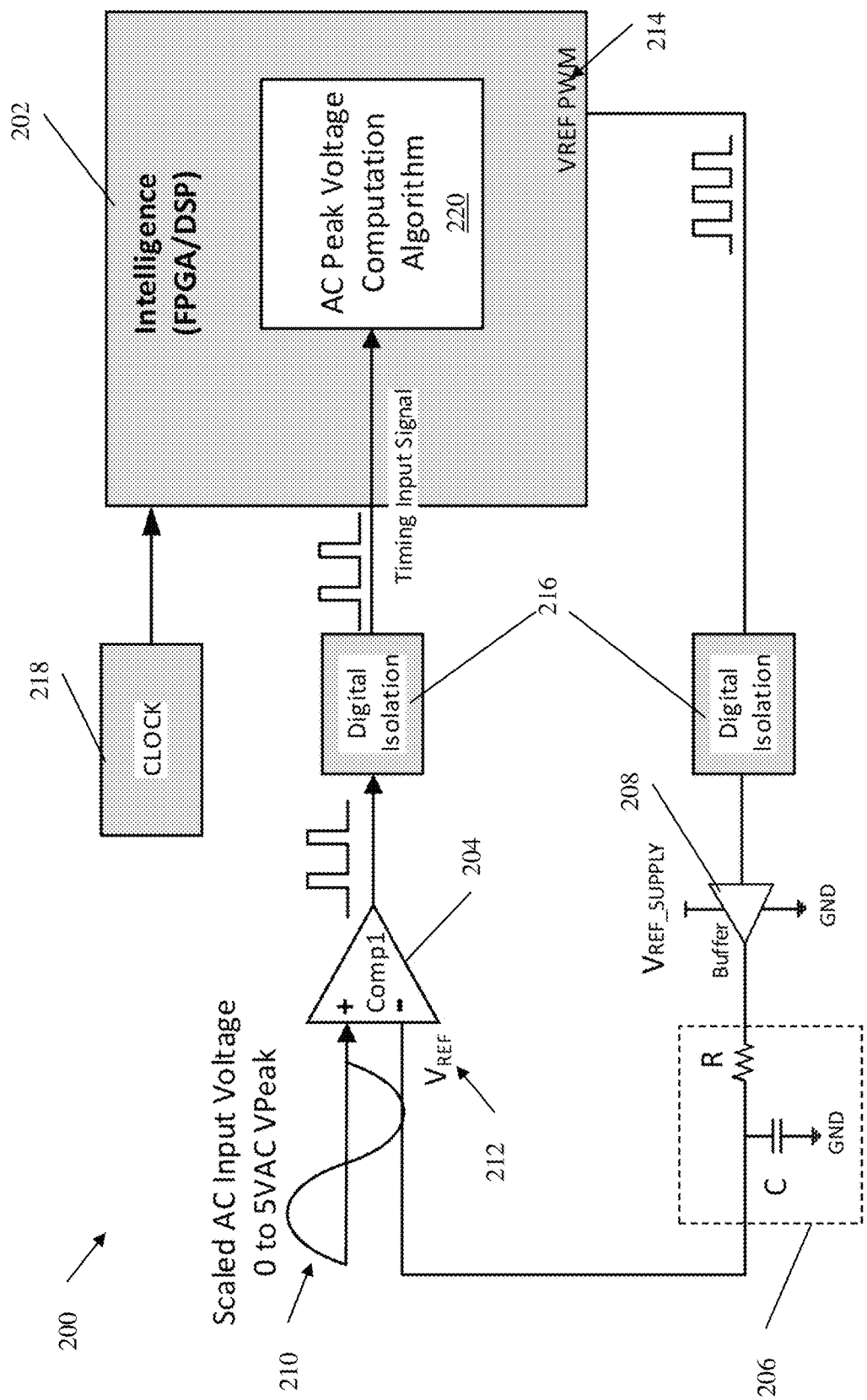
FIG. 2 depicts a block diagram of a system for measuring voltages according to one or more embodiments.

FIG. 2 depicts a block diagram of a system for measuring voltages according to one or more embodiments. The system 200 includes an intelligence engine 202. In one or more embodiments, the intelligence engine 202 can be an FPGA, microcontroller, or DSP, for example. In one or more embodiments, the intelligence engine 202 is configured to execute an AC peak voltage computation algorithm 220 which calculates an AC peak voltage of a scaled AC input voltage 210. To achieve this calculation, the intelligence engine 202 utilizes the remaining components of the system 200 that includes a comparator 204, two digital isolation circuits 216, a clock 218, a buffer 208, and an RC circuit 206.

In one or more embodiments, an AC input voltage can be received from a component on an aircraft, for example, that requires an AC voltage to be measured. The AC input voltage is scaled 210 before being input into the comparator 204. The comparator 204 compares the scaled AC input voltage 210 to a reference voltage (Vref) 212 which is a pulse width modulation (PWM) reference voltage 214 from the intelligence engine 202 after travelling through the digital isolation circuit 216, the buffer 208, and the RC circuit 206. The comparator 204 converts the scaled AC input voltage 210 into a digital PWM signal. The digital PWM signal is fed into the intelligence engine 202 through another digital isolation circuit 216 for further computation.

Figure 3:
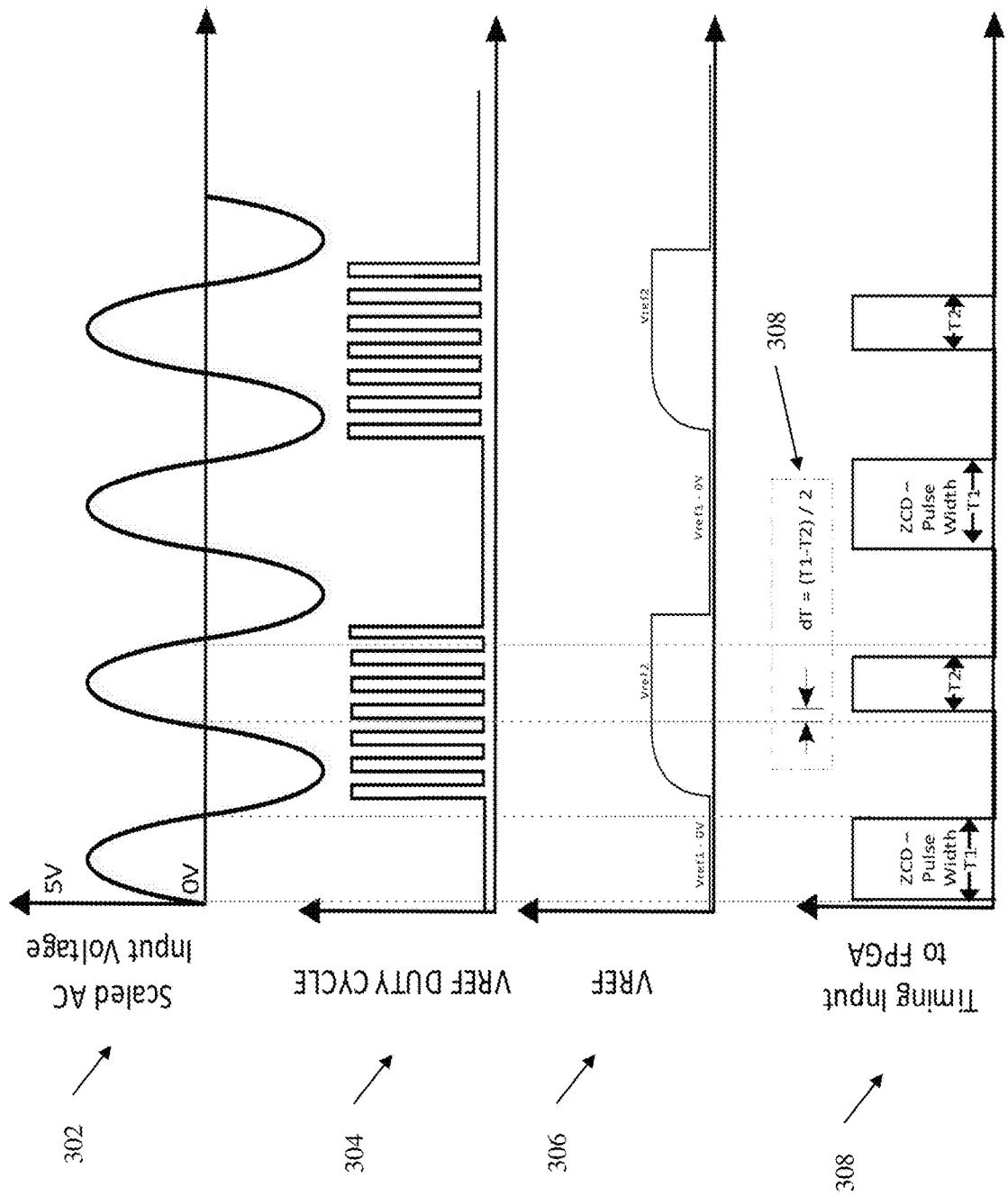
FIG. 3 depicts voltage graphs at various locations in the voltage measurement system according to one or more embodiments.

In one or more embodiments, the intelligence engine 202 can execute the AC peak voltage computation algorithm 220 which is described in further detail with reference to FIG. 3. FIG. 3 depicts voltage graphs at various locations in the voltage measurement system according to one or more embodiments. The first graph 302 shows the scaled AC input voltage (210 from FIG. 2) which is an input to the comparator (204 from FIG. 2). The second graph 304 shows the Vref duty cycle (214 from FIG. 2) which is supplied from the intelligence engine (202 from FIG. 2). The third graph 306 is the reference voltage (212 from FIG. 2) which is an input to the comparator (204 from FIG. 2). The fourth graph 308 shows the timing input into the intelligence engine (labeled as FPGA here). In one or more embodiments, during power ON, the intelligence sets the Vref PWM to 0% which results in the Vref being 0V inputted into the comparator 204. The third graph 306 shows the Vref as broken out into two parts showing a Vref1 and Vref2. Vref1 set at 0V in the third graph 306 gets compared to the scaled AC input voltage shown in the first graph 302. This results in the output of the comparator shown in the fourth graph 308 which is a pulse width shown as T1. This pulse width results because the comparator is comparing the positive input voltage from graph one 302 to the 0V reference voltage in graph three 306 resulting in a high output from the comparator. In one or more embodiments, the intelligence engine 202 can calculate the line frequency F as this corresponds to a zero crossing of the input AC voltage. The line frequency equation is shown below as equation [1].

$$\text{Line Frequency, } F = \frac{1}{2 \times T1} \qquad [1]$$

The output of the comparator shown in the fourth graph 308 shows the determination of frequency of the AC input voltage because for a rising edge and falling edge comparison, a width of half the duty cycle of the input voltage is shown. Hence, doubling the pulse width T1 and taking the inverse will result in the frequency. After the falling edge of the first pulse width T1, the Vref PWM duty cycle is set to an initial duty cycle %. As the Vref PWM signal travels through the buffer 208 and RC circuit 206, there is a charge up period as shown in graph three 306 and depicted as Vref2. Vref2 is high during the negative half cycle of the AC input voltage. As the positive half cycle of the AC input voltage begins, the comparator output provides a new pulse width T2 which is lesser than the first pulse width T1. The difference in the two pulse widths (ΔT) can be utilized for determining the input AC voltage peak by using equations 2 & 3 below.

$$\Delta T = \frac{T1 - T2}{2} \qquad [2]$$

$$\text{AC Voltage Peck} = \frac{VREF_2}{\text{sine}(2\pi F * \Delta T)} \qquad [3]$$

The AC Voltage peak value is calculated from equation [3] where the Vref2 from graph three 306 is known and the ΔT is calculated as the difference between the first pulse width T1 and the second pulse width T2.

All the components used in this approach are COTs parts as they are easier to get in extended operating temperature range. Replacing the ADC with comparator from the demodulation approach eases the verification and certification aspects.

Figure 4:
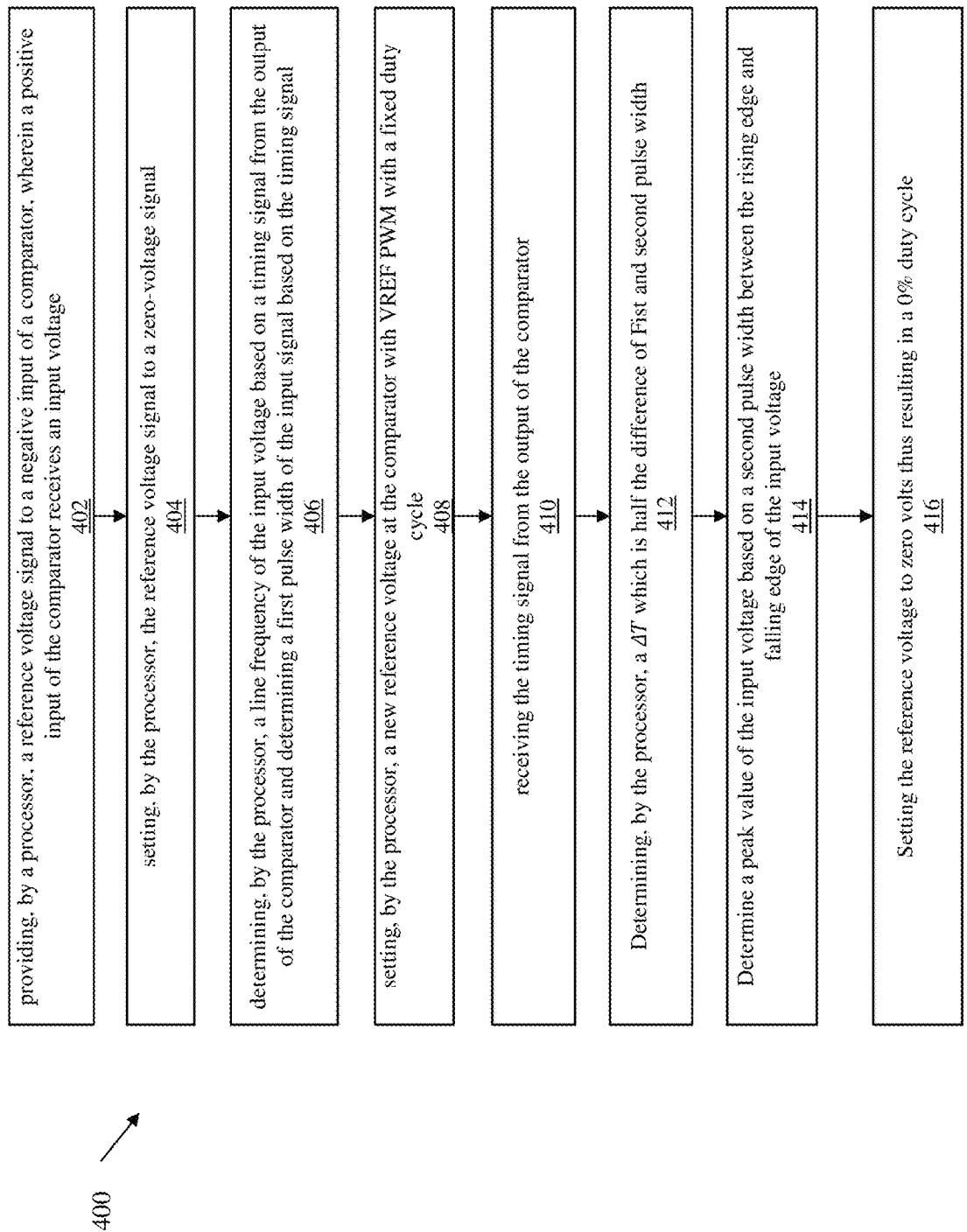
FIG. 4 depicts a flow diagram of a method for determining an AC voltage peak according to one or more embodiments.

FIG. 4 depicts a flow diagram of a method for determining an AC voltage peak according to one or more embodiments. The method 400 includes providing, by a processor, a reference voltage signal to a negative input of a comparator, wherein a positive input of the comparator receives an input voltage, as shown in block 402. At block 404, the method 400 includes setting, by the processor, the reference voltage signal to a zero voltage signal. Also, the method 400 includes determining, by the processor, a line frequency of the input voltage based on a timing signal from the output of the comparator and determining a first pulse width of the input signal based on the timing signal, as shown at block 406. And, at block 408, the method 400 includes setting, by the processor, the reference voltage to a pulse width modification signal with a first duty cycle. Also, the method 400, at block 410, includes receiving the timing signal from the output of the comparator. The method 400 includes determining a rising edge and a falling edge associated with the input voltage based on the timing signal, as shown at block 412. And at block 414, the method 400 includes determining a peak value of the input voltage based on a second pulse width between the rising edge and falling edge of the input voltage. The method at block 417 include setting the reference voltage to zero volts thus resulting in a 0% duty cycle. The 0% duty cycle then resets this method 400 for the reference voltage.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A voltage measurement system comprising:
    a comparator having a positive input terminal and a negative input terminal;
    a processor configured to:
        supply a reference voltage signal to the negative input terminal of the comparator, wherein the positive input terminal of the comparator receives an input voltage;
        setting the reference voltage signal to a zero voltage signal;
        determine a line frequency of the input voltage based on a timing signal from an output of the comparator and determining a first pulse width of the input voltage based on the timing signal;
set the reference voltage to a pulse width modification signal with a fixed duty cycle;
receive the timing signal from the output of the comparator;
determine a rising edge and a falling edge associated with the input voltage based on the timing signal; and
determine a peak value of the input voltage based on a second pulse width between the rising edge and falling edge of the input voltage.

2. The voltage measurement system of claim 1, wherein determining the line frequency of the input voltage based on a timing signal from the output of the comparator and determining the first pulse width associated with the timing signal comprises:
determining a second rising edge associated with the input voltage based on the timing signal;
determining a second falling edge associated with the input voltage based on the timing signal; and
calculating the first pulse width based on an output of the comparator between the second rising edge and the second falling edge.

3. The voltage measurement system of claim 1, wherein determining the peak value of the input voltage based on the second pulse width between the rising edge and falling edge of the input voltage comprises:
determining a delta between the first pulse width and the second pulse width; and
calculating the peak value of the input voltage based on the delta and the line frequency.

4. The voltage measurement system of claim 1, wherein the first pulse width is larger than the second pulse width.

5. The voltage measurement system of claim 1, wherein the input voltage is scaled prior to be received by the comparator.

6. The voltage measurement system of claim 1, wherein the input voltage is a voltage reading taken from a component on an aircraft.

7. The voltage measurement system of claim 1 further comprising:
a resistor capacitor (RC) circuit connected between a reference signal output of the processor and the negative input terminal of the comparator.

8. The voltage measurement system of claim 7 further comprising:
a buffer circuit connected between the RC circuit and the reference signal output of the processor, wherein the buffer circuit includes a reference voltage supply voltage.

9. The voltage measurement system of claim 8 further comprising:
a digital isolation circuit connected between the buffer circuit and the reference signal output of the processor.

10. The voltage measurement system of claim 1 further comprising:
a digital isolation circuit coupled between the output of the comparator and the processor.

11. A method for measuring voltage comprising:
providing, by a processor, a reference voltage signal to a negative input terminal of a comparator, wherein a positive input terminal of the comparator receives an input voltage;
setting, by the processor, the reference voltage signal to a zero voltage signal;
determining, by the processor, a line frequency of the input voltage based on a timing signal from an output of the comparator and determining a first pulse width of the input voltage based on the timing signal;
setting, by the processor, the reference voltage to a pulse width modification signal with a fixed duty cycle;
receiving the timing signal from the output of the comparator;
determining a rising edge and a falling edge associated with the input voltage based on the timing signal; and
determining a peak value of the input voltage based on a second pulse width between the rising edge and falling edge of the input voltage.

12. The method of claim 11, wherein determining the line frequency of the input voltage based on a timing signal from the output of the comparator and determining the first pulse width associated with the timing signal comprises:
determining a second rising edge associated with the input voltage based on the timing signal;
determining a second falling edge associated with the input voltage based on the timing signal; and
calculating the first pulse width based on an output of the comparator between the second rising edge and the second falling edge.

13. The method of claim 11, wherein determining the peak value of the input voltage based on the second pulse width between the rising edge and falling edge of the input voltage comprises:
determining a delta between the first pulse width and the second pulse width; and
calculating the peak value of the input voltage based on the delta and the line frequency.

14. The method of claim 11, wherein the first pulse width is larger than the second pulse width.

15. The method of claim 11, wherein the input voltage is scaled prior to be received by the comparator.

16. The method of claim 11, wherein the input voltage is a voltage reading taken from a component on an aircraft.

17. The method of claim 11, wherein a resistor capacitor (RC) circuit is connected between a reference signal output of the processor and the negative input terminal of the comparator.

18. The method of claim 17, wherein a buffer circuit is connected between the RC circuit and the reference signal output of the processor.

19. The method of claim 18, wherein a digital isolation circuit is connected between the buffer circuit and the reference signal output of the processor.

20. The method of claim 11, wherein a digital isolation circuit is coupled between the output of the comparator and the processor.

* * * * *